(12) United States Patent  (10) Patent No.: US 9,240,345 B2
Sung  (45) Date of Patent: Jan. 19, 2016

(54) SHALLOW TRENCH ISOLATION STRUCTURE HAVING AIR GAP, CMOS IMAGE SENSOR USING THE SAME AND METHOD OF MANUFACTURING CMOS IMAGE SENSOR

(75) Inventor: Nag Kyun Sung, Chungcheongbuk-do (KR)

(73) Assignee: INTELLECTUAL VENTURES II LLC, Wilmington, DE (US)

( * ) Notice: Subject to any disclaimer, the term of this patent is extended or adjusted under 35 U.S.C. 154(b) by 530 days.

(21) Appl. No.: 13/058,039

(22) PCT Filed: Aug. 27, 2009

(86) PCT No.: PCT/KR2009/004776
§ 371 (c)(1),
(2), (4) Date: Apr. 19, 2011

(87) PCT Pub. No.: WO2010/024595
PCT Pub. Date: Mar. 4, 2010

(65) Prior Publication Data
US 2011/0186918 A1  Aug. 4, 2011

(30) Foreign Application Priority Data

Aug. 27, 2008 (KR) .................. 10-2008-0083736

(51) Int. Cl.
*H01L 21/764* (2006.01)
*H01L 21/762* (2006.01)
(Continued)

(52) U.S. Cl.
CPC ........ *H01L 21/764* (2013.01); *H01L 21/76224* (2013.01); *H01L 27/1463* (2013.01); *H01L 27/14643* (2013.01); *H01L 27/14689* (2013.01); *H01L 21/823481* (2013.01)

(58) Field of Classification Search
CPC ....................................... H01L 21/764
USPC ........................................ 438/422
See application file for complete search history.

(56) References Cited

U.S. PATENT DOCUMENTS 5,098,856 A * 3/1992 Beyer et al. ............. 438/422
RE35,810 E * 5/1998 Prall ....................... 438/257
(Continued)

FOREIGN PATENT DOCUMENTS

EP 1209738 5/2002
JP 2004342960 12/2004
(Continued)

OTHER PUBLICATIONS

International Search Report corresponding to International Patent Application Serial No. PCT/KR2009/004776, mailed Mar. 15, 2010.
(Continued)

*Primary Examiner* — Kenneth Parker
*Assistant Examiner* — Christopher Culbert
(74) *Attorney, Agent, or Firm* — McAndrews, Held & Malloy, Ltd.

(57) ABSTRACT

Disclosed is a shallow trench isolation structure having an air gap for suppressing the dark currents and cross-talk which occur in CMOS image sensors. The shallow trench isolation structure suppresses photons injected from neighboring pixels and dark current, so that high-quality images are obtained. Since impurities are removed from a p type ion implantation region for a photodiode when an inner wall oxide layer is etched to form the air gap, the p type ion implantation region has a uniform doping profile, thereby suppressing the diffusion of electrons towards the surface and achieving an image having a high quality.

22 Claims, 3 Drawing Sheets

(51) Int. Cl.
*H01L 27/146* (2006.01)
*H01L 21/8234* (2006.01)

(56) References Cited

U.S. PATENT DOCUMENTS

| | | | |
|---|---|---|---|
| 6,268,637 B1* | 7/2001 | Gardner et al. | 257/522 |
| 7,396,732 B2* | 7/2008 | Kunnen | 438/322 |
| 2001/0045608 A1* | 11/2001 | Tseng et al. | 257/410 |
| 2004/0038533 A1 | 2/2004 | Liang | |
| 2005/0139952 A1 | 6/2005 | Koh | |
| 2006/0030128 A1 | 2/2006 | Bu et al. | |
| 2006/0131655 A1 | 6/2006 | Kunnen | |
| 2007/0054434 A1* | 3/2007 | Park et al. | 438/48 |
| 2007/0200148 A1 | 8/2007 | Hirata et al. | |
| 2008/0001073 A1 | 1/2008 | Mouli | |
| 2008/0003748 A1* | 1/2008 | Cho et al. | 438/259 |

FOREIGN PATENT DOCUMENTS

| | | |
|---|---|---|
| JP | 2005322859 | 11/2005 |
| JP | 2007227761 | 9/2007 |
| KR | 10-2004-0070799 | 8/2004 |

OTHER PUBLICATIONS

Supplementary European Search Report for EP 09 81 0200, dated Oct. 29, 2014, 6 pages.

* cited by examiner

SHALLOW TRENCH ISOLATION STRUCTURE HAVING AIR GAP, CMOS IMAGE SENSOR USING THE SAME AND METHOD OF MANUFACTURING CMOS IMAGE SENSOR

CROSS-REFERENCE TO RELATED APPLICATIONS

The present application is a 35 U.S.C. §371 national stage filing of PCT Application PCT/KR2009/004776, filed Aug. 27, 2009, which claims priority to KR Application 10-2008-0083736, filed Aug. 27, 2008. Each of the above-identified applications are incorporated herein by reference in their entirety.

TECHNICAL FIELD

The present invention relates to a semiconductor device, such as a CMOS sensor. More particularly, the present invention relates to a shallow trench isolation structure having an air gap, a CMOS image sensor using the same, and a method of manufacturing the CMOS sensor.

BACKGROUND ART

With the development of semiconductor manufacturing technology, the application fields for semiconductor devices have increased, so various studies and research have been extensively performed to increase the integration degree of the semiconductor devices. As the integration degree of semiconductor devices has increased, studies have been increasingly pursued to fabricate semiconductor devices in a micro-size based on micro-fabrication processes. In micro-fabrication technology for semiconductor devices, isolation layer diminishing technology for isolating devices from each other to integrate devices is very important.

As a conventional isolation technology, the LOCOS (local oxidation of silicon) technology forms an isolation layer by selectively growing a thick oxide layer on a semiconductor substrate. However, according to the LOCOS technology, an oxide layer is formed in a region where a lateral diffusion is not required, so that there is limitation to reduce the width of an isolation layer.

Therefore, the LOCOS technology is not applicable for a semiconductor device having a scale of submicron, so a new isolation technology is required.

In this regard, a shallow trench isolation technology has been suggested. According to the shallow trench isolation technology, a shallow trench is formed in a semiconductor device through an etching process, and an insulating material is filled in the shallow trench, thereby reducing the width of the isolation region more than the LOCOS technology.

Such a shallow trench isolation technology is applied to a CMOS image sensor, which is a semiconductor device for converting an optical image into an electric signal. As a photo device is highly integrated, the size of a photodiode used in the CMOS image sensor is also reduced. In this case, the photons injected into neighboring pixels may generate electrons and holes in other pixels while passing through the shallow trench isolation structure, so that the optical device characteristic may be degraded. That is, the dark current and crosstalk may occur in the CMOS image sensor, so there is an endeavor to improve the characteristics of the optical device by solving the dark current and crosstalk.

DETAILED DESCRIPTION OF THE INVENTION

Technical Problem

Accordingly, the present invention has been made to solve the above-mentioned problems occurring in the prior art, and an object of the present invention is to provide a shallow trench isolation structure capable of preventing degradation of the optical device characteristics caused by high integration of optical devices.

Another object of the present invention is to provide a CMOS image sensor having such a shallow trench isolation structure and a method of manufacturing the same.

Technical Solution

In accordance with an aspect of the present invention, there is provided a shallow trench isolation structure comprising: a trench formed on an inactive region of a substrate; an inner wall oxide layer formed on the trench; a liner formed on the inner wall oxide layer; an oxide layer formed on the liner to fill the trench; an air gap formed between the trench and the liner; and a buffer layer to seal the air gap.

The air gap may be formed at one lateral side of the trench.

The air gap may be formed at both lateral sides of the trench.

The air gap may be formed at one lateral side and a bottom surface of the trench.

The air gap may be formed by selectively etching the inner wall oxide layer.

The liner may have a thickness sufficient for preventing the liner from being removed when the inner wall oxide layer is selectively etched.

The buffer layer may include one of CVD $SiO_2$, SiON, $Si_3N_4$, and polysilicon.

In accordance with another aspect of the present invention, there is provided a method of manufacturing a CMOS image sensor, the method comprising the steps of: forming a shallow trench isolation structure including a trench, an inner wall oxide layer, a liner, and an oxide layer on a substrate; forming a gate pattern on the substrate; forming an n type ion implantation region for a photodiode in the substrate; forming a spacer at both sidewalls of the gate pattern; forming a floating diffusion region on the substrate; forming an air gap between the trench and the liner; forming a buffer layer to cover the air gap; and forming a p type ion implantation region for the photodiode in the substrate.

The step of forming the air gap may include the steps of: forming an etch mask such that the inner wall oxide layer formed between the trench and the liner is selectively exposed; and etching the exposed inner wall oxide layer.

In the step of forming the etch mask, the etch mask may be formed such that the inner wall oxide layer is exposed at one lateral side of the trench.

In the step of forming the etch mask, the etch mask may be formed such that the inner wall oxide layer is exposed at both lateral sides of the trench.

In the step of etching the inner wall oxide layer, a part of the inner wall oxide layer may be etched at the lateral side of the trench to form the air gap at a part of the lateral side of the trench.

In the step of etching the inner wall oxide layer, the inner wall oxide layer may be etched at the lateral side of the trench to form the air gap on an entire surface of the lateral side of the trench.

In the step of etching the inner wall oxide layer, the inner wall oxide layer may be etched at one lateral side and a bottom surface of the trench to form the air gap on the lateral side and the bottom surface of the trench.

The etching rate of an etchant used in the step of etching the inner wall oxide layer may be relatively high with respect to an oxide layer, and relatively low with respect to silicon.

The liner may have a thickness sufficient for preventing the liner from being removed when the inner wall oxide layer is etched.

The buffer layer may include a material capable of suppressing diffusion of metal ions in a salicide process.

The buffer layer may include one of CVD $SiO_2$, SiON, $Si_3N_4$, and polysilicon.

In accordance with still another aspect of the present invention, there is provided a CMOS image sensor manufactured through the above method.

Advantageous Effects

According to the CMOS image sensor of the present invention, the shallow trench isolation structure has the air gap to suppress photons injected from neighboring pixels and to suppress the generation of dark current, so a high quality image can be achieved.

In addition, impurities are removed from a p type ion implantation region for a photodiode when the inner wall oxide layer is etched in order to form the air gap, so that the p type ion implantation region may have a uniform doping profile, thereby suppressing the diffusion of electrons toward the surface and achieving high-quality images.

DESCRIPTION OF DRAWINGS

The above and other objects, features and advantages of the present invention will be more apparent from the following detailed description taken in conjunction with the accompanying drawings, in which.

MODE OF OPERATION OF INVENTION

Figure 1:
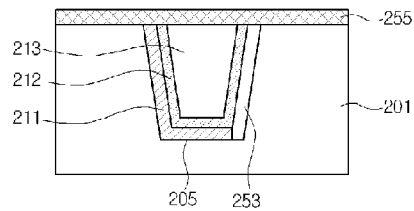
FIGS. 1 to 3 are sectional views showing a shallow trench isolation structure according to an embodiment of the present invention.

Hereinafter, exemplary embodiments of the present invention will be described in detail with reference to the accompanying drawings. Detailed description about well known functions or configurations will be omitted if they make the subject matter of the present invention unclear. Meanwhile, elements shown in the drawings can be simplified or magnified for the purpose of clear explanation. In addition, the position of specific layers or regions may represent relative positions and a third layer may be interposed therebetween.

Figure 2:
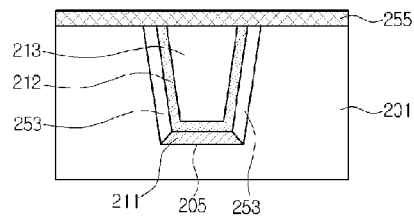
Figure 3:
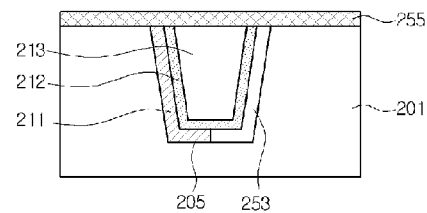

FIGS. 1 to 3 are sectional views showing a shallow trench isolation structure according to an embodiment of the present invention.

As shown in FIG. 1, the shallow trench isolation structure according to an embodiment of the present invention includes a trench 205, an inner wall oxide layer 211, a liner 212, an oxide layer 213 and an air gap 253.

The trench 205 is formed at an inactive region of a substrate 201 through an etching process.

The inner wall oxide layer 211 is formed on the trench 205 through a wet thermal oxidation process or a dry thermal oxidation process.

The liner 212 is formed on the inner wall oxide layer 211. The liner 212 may include a nitride layer deposited though a chemical vapor deposition (CVD) process.

The oxide layer 213 is formed on the inner wall oxide layer 211 and fills the trench 205.

The air gap 253 is formed between the trench 205 and the liner 212. The air gap 253 increases the dielectric constant of the shallow trench isolation structure and improves the insulating effect. According to one embodiment of the present invention, the air gap 253 can be formed by selectively etching the inner wall oxide layer 211. The method for forming the air gap 253 will be described later in detail.

As shown in FIG. 1, the air gap 253 is formed at one side of the trench 205. Although the air gap 253 is formed on an entire surface of one side of the trench 205 in FIG. 1, the air gap 253 can be formed on a part of one side of the trench 205. The size of the air gap 253 is determined according to the etching degree of the inner wall oxide layer 211.

As shown in FIG. 2, the air gap 253 can be formed at both lateral sides of the trench 205. Although the air gap 253 is formed on an entire surface of both lateral sides of the trench 205 in FIG. 2, the air gap 253 can be formed on a part of both lateral sides of the trench 205 by adjusting the etching degree of the inner wall oxide layer 211.

As shown in FIG. 3, the air gap 253 can be formed at a lateral side and a bottom surface of the trench 205. The air gap 253 shown in FIG. 3 can be obtained by further etching the inner wall oxide layer 211 shown in FIG. 1.

A buffer layer 255 is formed on the air gap 253 to seal the air gap 253. As the subsequent process is performed after the shallow trench isolation structure has been formed, the buffer layer 255 may be removed so that the air gap 253 may be exposed. Thus, the buffer layer 255 has a thickness sufficient for sealing the air gap 253. According to an embodiment of the present invention, the buffer layer 255 can be formed by depositing CVD $SiO_2$, SiON, $Si_3N_4$, or polysilicon.

Figure 4:
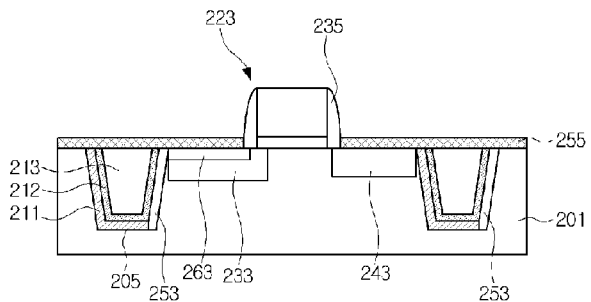
FIG. 4 is a sectional view showing a CMOS image sensor according to one embodiment of the present invention.

FIG. 4 is a sectional view showing a CMOS image sensor according to one embodiment of the present invention, focusing on a photodiode and a transfer transistor. As shown in FIG. 4, the CMOS image sensor according to one embodiment of the present invention is isolated by the shallow trench isolation structure having the air gap 253. Reference numeral 223 represents a gate pattern including an insulating layer and a conductive layer, reference numeral 235 represents a spacer formed at both side walls of the gate pattern 223, reference numeral 233 represents an n type ion implantation region formed in a photodiode region to form the photodiode, reference numeral 263 represents a p type ion implantation region formed in the photodiode region to form the photodiode, and reference numeral 243 represents a floating diffusion region.

Since the CMOS image sensor shown in FIG. 4 employs the shallow trench isolation structure having the air gap 253, photons injected from neighboring pixels can be suppressed and generation of the dark current can be suppressed, so that an image having high quality can be achieved.

FIGS. 5 to 17 are views showing the procedure for manufacturing the CMOS image sensor according to one embodiment of the present invention. FIGS. 5 to 17 are illustrated while focusing on the photodiode and the transfer transistor in a unit pixel of the CMOS image sensor. Although four transistors may constitute the unit pixel, only the transfer transistor is shown and the remaining three transistors are omitted in the drawings.

Figure 5:
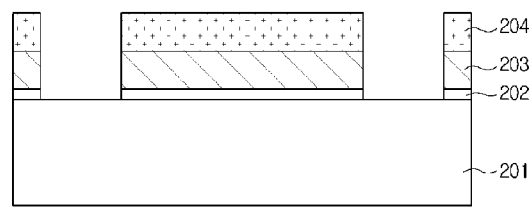
FIGS. 5 to 17 are views showing the procedure for manufacturing a CMOS image sensor according to one embodiment of the present invention.

According to the procedure for manufacturing the CMOS image sensor of the present invention, as shown in FIG. 5, the thermal oxide layer is grown on the substrate 201 to form a pad oxide layer 202 that attenuates the stress of the substrate 201 while protecting the substrate 201. A pad nitride layer 203, which is used as a mask in the planarization process, is formed on the pad oxide layer 202. The pad nitride layer 203 can be formed through a CVD process. Then, the photo process is performed to form a photoresist pattern 204 that exposes the inactive region on the pad nitride layer 203. After that, the pad nitride layer 203 and the pad oxide layer 202 are etched using the photoresist pattern 204 as a mask, thereby exposing the inactive region of the substrate 201.

Figure 6:
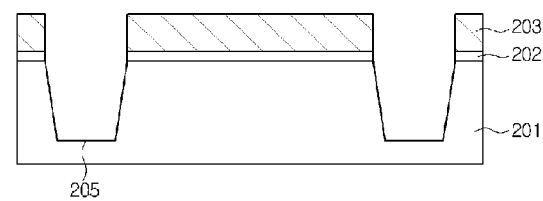

Then, as shown in FIG. 6, the photoresist pattern 204 is removed and the trench 205 is formed using the pad nitride layer 203 and the pad oxide layer 202 as an etch mask.

Figure 7:
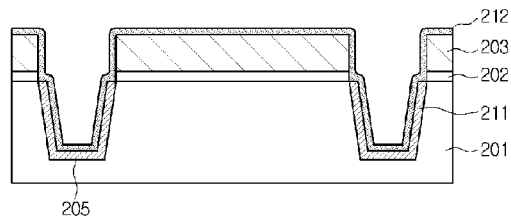

After that, as shown in FIG. 7, the thermal oxidation process is performed with respect to the substrate 201, thereby forming the inner wall oxide layer 211 at the inner wall of the trench 205. Then, the liner 212 is formed by depositing a silicon nitride layer on the entire surface of the resultant structure formed with the inner wall oxide layer 211.

Figure 8:
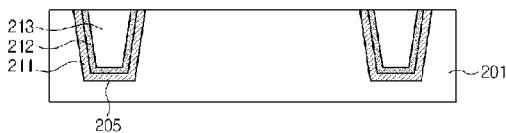

Then, as shown in FIG. 8, the oxide layer 213 is formed such that the trench 205 can be filled with the oxide layer 213, and the planarization process is performed. The etch back process or the chemical mechanical polishing process can be performed in the planarization process, or both the etch back process and the chemical mechanical polishing process can be performed in the planarization process.

Figure 9:
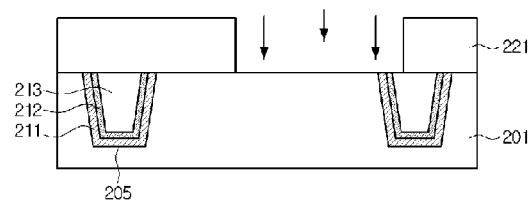

Next, as shown in FIG. 9, the photoresist pattern 221 is formed before the gate pattern 223 is formed, and the ion implantation process is performed with respect to a region adjacent to the photodiode region using the photoresist pattern 221 to improve the punch-through characteristic.

Figure 10:
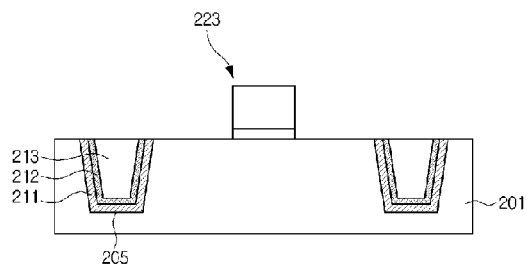

Then, as shown in FIG. 10, the gate pattern 223 having the stack structure of the insulating layer and the conductive layer is formed.

Figure 11:
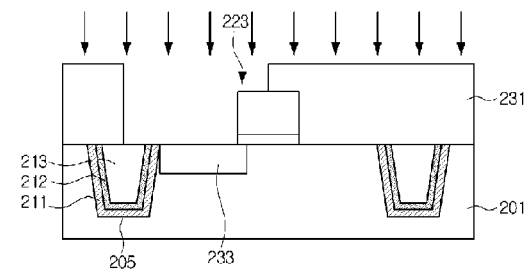

After that, as shown in FIG. 11, the n type ion implantation region 233 for the photodiode is formed using the ion implantation mask 231.

Figure 12:
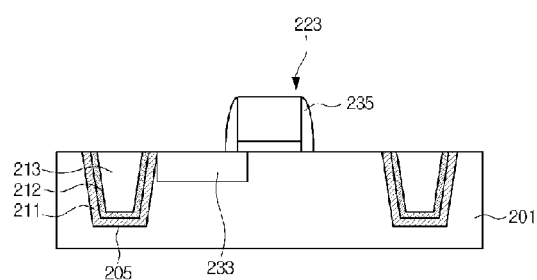

Then, as shown in FIG. 12, the spacer 235 is formed at both lateral sides of the gate pattern 223.

Figure 13:
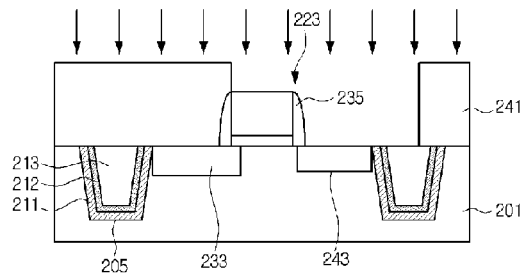

After that, as shown in FIG. 13, the floating diffusion region 243 is formed using the ion implantation mask 231.

Figure 14:
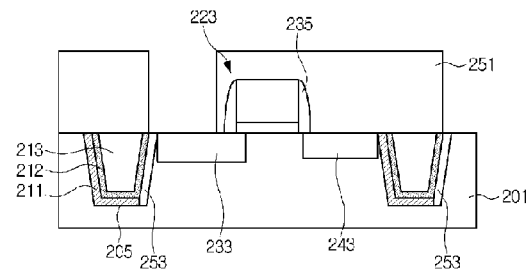

Then, as shown in FIG. 14, the etch mask 251 is formed such that the inner wall oxide layer 211 of the shallow trench isolation structure can be selectively exposed through the etch mask 251, and the etching process is performed. As the etching process is performed, the inner wall oxide layer 211 is partially removed, so that the air gap 253 is formed. As described above, the air gap 253 suppresses the dark current and the crosstalk, so that the characteristics of the optical device can be improved.

Figure 16:
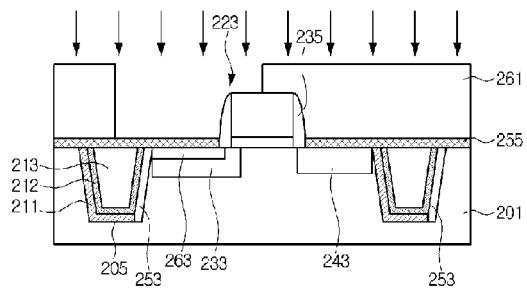

The etch mask 251 is formed such that the p type ion implantation region 263 for the photodiode, which is formed in the subsequent process as shown in FIG. 16, can be exposed.

Since impurities are removed from the p type ion implantation region 263 when the etching process is performed to form the air gap, the p type ion implantation region 263 may have a uniform doping profile, thereby suppressing the diffusion of electrons toward the surface and achieving high-quality images.

Referring to FIG. 14, according to one embodiment of the present invention, the etch mask 251 is formed such that the inner wall oxide layer 211 can be exposed at one side of the trench 205. However, according to another embodiment of the present invention, the etch mask 251 can be formed such that the inner wall oxide layer 211 can be exposed at both sides of the trench 205. The air gap 253 may be formed at both sides of the trench 205 through the etching process.

Referring to FIG. 14, according to one embodiment of the present invention, the air gap 253 is formed on an entire surface of one side of the trench 205. However, according to another embodiment of the present invention, the air gap 253 can be formed on a part of one side of the trench 205 by etching a part of the inner wall oxide layer 211 formed at the side of the trench 205. In addition, the air gap 253 can be formed at a lateral side and a bottom surface of the trench 205 by etching the inner wall oxide layer 211 formed at the lateral side and the bottom surface of the trench 205. The size of the air gap 253 is adjustable by adjusting the etching degree of the inner wall oxide layer 211.

The etchant used in the etching process may include liquid, gas or a mixture of liquid and gas. In order to facilitate the formation of the air gap 253, the etching rate of the etchant is relatively high with respect to the oxide layer and relatively low with respect to silicon. In addition, the liner 212 must have a thickness sufficient for preventing the liner 212 from being removed through the etching process.

Figure 15:
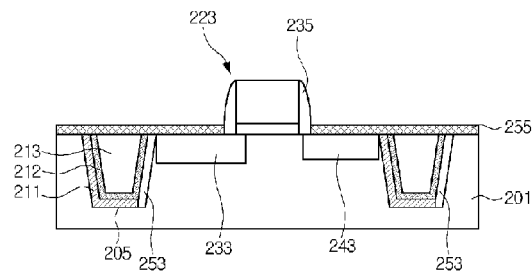

Then, as shown in FIG. 15, the photoresist pattern 251 is removed and the buffer layer 255 is formed to cover the air gap 253. The buffer layer 255 seals the air gap 253 to prevent the air gap 253 from being exposed. Preferably, the buffer layer 255 may include a material capable of suppressing the diffusion of metal ions in the subsequent salicide process. For instance, the buffer layer 255 may include CVD $SiO_2$, SiON, $Si_3N_4$, or polysilicon.

After that, as shown in FIG. 16, the p type ion implantation region 263 for the photodiode is formed using the ion implantation mask 261. As described above, since the impurities are removed from the p type ion implantation region 263 for the photodiode when the inner wall oxide layer 211 is etched in order to form the air gap 253, the p type ion implantation region 253 may have a uniform doping profile.

Figure 17:
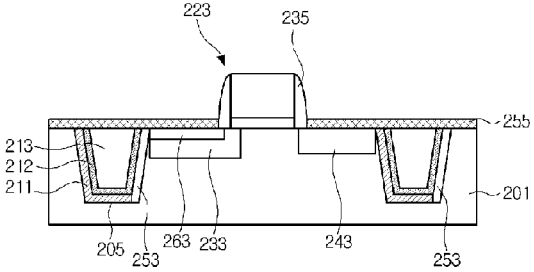

FIG. 17 shows the substrate where the ion implantation mask 261 has been removed. After that, the salicide process and the process for forming the control hole are performed. These processes are generally known in the art, so details thereof will be omitted.

Although an exemplary embodiment of the present invention has been described for illustrative purposes, those skilled in the art will appreciate that various modifications, additions and substitutions are possible, without departing from the scope and spirit of the invention as disclosed in the accompanying claims.

INDUSTRIAL APPLICABILITY

The shallow trench isolation structure according to the present invention includes a trench formed on an inactive region of a substrate; an inner wall oxide layer formed on the trench; a liner formed on the inner wall oxide layer; an oxide layer formed on the liner to fill the trench; an air gap formed between the trench and the liner; and a buffer layer to seal the air gap, to suppress the photons injected from neighboring pixels and generation of dark current, thereby achieving an image having high quality. In addition, since the impurities are removed from the p type ion implantation region for the photodiode when the inner wall oxide layer is etched in order to form the air gap, the p type ion implantation region may have a uniform doping profile. Further, electrons are prevented from diffusing toward the surface and an image having high quality can be obtained. Thus, the shallow trench isolation structure according to the present invention can be utilized in the sales and business fields, in practice.

The invention claimed is:

1. A method of forming an isolation trench that isolates an integrated device from a neighboring integrated device, the method comprising:
   forming a trench of the isolation trench in an upper surface of a substrate and between a first integrated device location and a second integrated device location, wherein an inner surface of the trench includes a first lateral surface associated with the first integrated device location, a second lateral surface associated with the second integrated device location, and a bottom surface that connects the first lateral surface and the second lateral surface;
   forming an inner wall oxide layer on the inner surface of the trench such that the inner wall oxide layer includes an upper surface and lower surface that are each conformal with the first lateral surface, the second lateral surface, and the bottom surface of the trench;
   forming a liner layer on the inner wall oxide layer such that the liner layer includes an upper surface and a lower surface that are each conformal with the upper surface of the inner wall oxide layer and the first lateral surface, the second lateral surface, and the bottom surface of the trench; and
   removing at least a portion of the inner wall oxide layer, wherein the removed portion of the inner wall oxide layer creates an air gap between the inner surface of the trench and the lower surface of the liner layer.

2. The method of claim 1, further comprising:
   forming an etch mask that selectively exposes the inner wall oxide layer;
   wherein said removing at least a portion of the inner wall oxide layer includes etching the exposed inner wall oxide layer to remove the at least a portion of the inner wall oxide from the inner surface of the trench.

3. The method of claim 2, wherein said forming an etch mask comprises exposing the inner wall oxide layer along the first lateral surface of the trench.

4. The method of claim 2, wherein said forming an etch mask comprises exposing the inner wall oxide layer along the first lateral surface and the second lateral surface of the trench.

5. The method of claim 2, wherein said removing comprises etching a part of the inner wall oxide layer along the first lateral surface of the trench to form the air gap such that the air gap is conformal with the first lateral surface of the trench and extends along at least a portion of the first lateral surface of the trench.

6. The method of claim 2, wherein said removing comprises etching the inner wall oxide layer along the first lateral surface of the trench to form the air gap such that the air gap is conformal with the first lateral surface of the trench and extends along an entire surface of the first lateral surface of the trench.

7. The method of claim 2, wherein said removing comprises etching the inner wall oxide layer along the first lateral surface to form the air gap such that the air gap is conformal with the first lateral surface and the bottom surface of the trench and extends along the first lateral surface and at least a portion of the bottom surface of the trench.

8. The method of claim 2, wherein said removing comprises using an etchant having an etching rate that is relatively high with respect to the inner wall oxide layer and relatively low with respect to silicon.

9. The method of claim 2, wherein said forming a liner layer comprises forming the liner layer with a thickness sufficient to prevent said etching from completely removing the liner layer.

10. The method of claim 1, further comprising:
    forming a gate pattern on the substrate above the first integrated device location;
    forming an n-type ion implantation region of a photodiode in the substrate between the trench and the gate pattern;
    forming a spacer at both sidewalls of the gate pattern;
    forming a floating diffusion region in the substrate on a side of the gate pattern opposite n-type ion implantation region of the photodiode; and
    forming a p-type ion implantation region of the photodiode in the substrate.

11. The method of claim 1, further comprising forming a buffer layer that seals an exposed portion of the air gap toward an upper surface of the substrate by forming the buffer layer over at least the liner layer, the exposed portion of the air gap, and a portion of the upper surface of the substrate.

12. The method of claim 11, wherein said forming a buffer layer comprises using a material for the buffer layer that is capable of suppressing diffusion of metal ions in a salicide process.

13. The method of claim 12, wherein the buffer layer comprises one of $SiO_2$, $SiON$, $Si_3N_4$, or polysilicon.

14. The method of claim 1, further comprising forming an oxide layer on the upper surface of the liner layer such that the oxide layer includes a lower surface that is conformal with the upper surface of the liner layer and the first lateral surface, the second lateral surface, and the bottom surface of the trench.

15. A method of forming an isolation trench that isolates an integrated device from a neighboring integrated device, the method comprising:
    forming a trench of the isolation trench in an upper surface of a substrate and between a first integrated device location and a second integrated device location, wherein an inner surface of the trench includes a first lateral surface associated with the first integrated device location, a second lateral surface associated with the second integrated device location, and a bottom surface that connects the first lateral surface and the second lateral surface;
    forming an inner wall oxide layer on the inner surface of the trench such that the inner wall oxide layer includes a first lateral side, a second lateral side, and a bottom that respectively traverse along the first lateral surface, the second lateral surface, and the bottom surface of the trench;
    forming a liner layer on the inner wall oxide layer such that the liner layer comprises a first lateral side, a second lateral side, and a bottom that respectively traverse along the first lateral side, the second lateral side, and the bottom of the inner wall oxide layer; and
    after said forming a liner layer, removing at least a portion of the inner wall oxide layer that traverses along the first lateral surface of the trench to form an air gap directly between the first lateral surface of the trench and the first lateral side of the liner layer.

16. The method of claim 15, further comprising forming an oxide layer on the liner layer such that the oxide layer includes a lower surface that traverses along the first lateral side, the second lateral side, and the bottom of the liner layer.

17. The method of claim 15, further comprising:
    forming an etch mask that selectively exposes the inner wall oxide layer;

wherein said removing at least a portion of the inner wall oxide layer includes etching the exposed inner wall oxide layer to remove the at least a portion of the inner wall oxide from the inner surface of the trench.

18. The method of claim 15, wherein said removing comprises etching a part of the inner wall oxide layer along the first lateral surface of the trench to form the air gap such that the air gap extends along at least a portion of the first lateral surface of the trench.

19. The method of claim 15, wherein said removing comprises etching the inner wall oxide layer along the first lateral surface of the trench to form the air gap such that the air gap extends along an entire surface of the first lateral surface of the trench.

20. The method of claim 15, wherein said removing comprises etching the inner wall oxide layer along the first lateral surface to form the air gap such that the air gap extends along the first lateral surface and at least a portion of the bottom surface of the trench.

21. The method of claim 15, further comprising:
forming a gate pattern on the substrate above the first integrated device location;
forming an n-type ion implantation region of a photodiode in the substrate between the trench and the gate pattern;
forming a spacer at both sidewalls of the gate pattern;
forming a floating diffusion region in the substrate on a side of the gate pattern opposite n-type ion implantation region of the photodiode; and
forming a p-type ion implantation region of the photodiode in the substrate.

22. The method of claim 15, further comprising forming a buffer layer that seals an exposed portion of the air gap toward an upper surface of the substrate by forming the buffer layer over at least the liner layer, the exposed portion of the air gap, and a portion of the upper surface of the substrate.

* * * * *